United States Patent [19]

Davis et al.

[11] E Re. 31,051

[45] Reissued Oct. 5, 1982

[54] REGULATOR FOR CONTROLLING CAPACITOR CHARGE TO PROVIDE COMPLEX WAVEFORM

[75] Inventors: William F. Davis; Howard G. Shumway, both of Tempe, Ariz.; Thomas M. Frederiksen, San Jose, Calif.

[73] Assignee: Motorola Inc., Schaumburg, Ill.

[21] Appl. No.: 566,868

[22] Filed: Apr. 10, 1975

Related U.S. Patent Documents

Reissue of:

[64] Patent No.: 3,727,081
Issued: Apr. 10, 1973
Appl. No.: 189,630
Filed: Oct. 15, 1971

[51] Int. Cl.[3] ..... H03K 4/02; H03K 4/12

[52] U.S. Cl. ..... 307/260; 123/485; 307/246; 307/268; 307/494; 320/1

[58] Field of Search ..... 307/229, 243, 246, 260, 307/264, 268, 494, 490; 320/1; 328/142, 143; 123/32 EA

[56] References Cited

U.S. PATENT DOCUMENTS

| | | | |
|---|---|---|---|
| 2,920,217 | 1/1960 | House | 307/260 X |
| 3,430,073 | 2/1969 | Leonard | 307/260 |
| 3,559,098 | 1/1971 | Chandos | 307/246 X |
| 3,643,180 | 2/1972 | Shimamuya | 307/229 X |

*Primary Examiner*—John Zazworsky
*Attorney, Agent, or Firm*—Maurice J. Jones, Jr.

[57] ABSTRACT

In fuel injection ignition systems, it is necessary to provide control of the open time of the fuel injector valves which varies with the engine speed. However, for efficient operation with a minimum of pollution, the relationship of valve open time to engine speed is not a simple relationship, and factors other than engine speed are involved. It has been found that the open time should change with engine speed by steps not directly related to engine speed. This can be accomplished by providing a waveform which varies with time across a capacitor by a regulator system which controls both increase and decrease of the voltage across the capacitor. This voltage waveform, which varies with time and is independent of engine speed, can then be combined with a ramp voltage initiated at a particular point of rotation of the engine at the time the injector valves are opened. The valves can then be turned off when the combined voltage has the desired relation to a voltage produced by manifold pressure to provide the required open time for the injector valves.

51 Claims, 3 Drawing Figures

REGULATOR FOR CONTROLLING CAPACITOR CHARGE TO PROVIDE COMPLEX WAVEFORM

Matter enclosed in heavy brackets [ ] appears in the original patent but forms no part of this reissue specification; matter printed in italics indicates the additions made by reissue.

BACKGROUND OF THE INVENTION

Electronic fuel injection systems require accurate electronic means for opening and closing the fuel injector valves over a wide range of engine speeds. Maximum efficiency of the engine requires the best possible mixture of air and fuel at any given engine speed. The necessary open time for the injector valve at any given speed can be determined within fairly precise limits to reduce the chances of hydrocarbon pollution. However, the open time is dependent not only on the speed of the engine, but also on water temperature, air temperature, and other conditions of the environment. Experiments have shown that there is no simple mathematical relationship of the valve open time with respect to engine speed. However, it has been determined that satisfactory operation is obtained if the open time of the valve is changed for different portions of the speed range within the wide range of operating speeds which may be used. To provide the changes in open time for the various speeds requires a relatively complex control system which tends to be expensive.

SUMMARY OF THE INVENTION

It is an object of the present invention to provide a system for precisely controlling the open time of the injector valves in a fuel injection system for maximizing the efficiency thereof.

It is another object of the present invention to provide precise control of the opening and closing of the fuel injector valves for an engine which operates over a wide range of engine speeds, which has an accuracy within one percent over a temperature range of from −50° to +135° F.

Another object of the present invention is to provide a control for charging a capacitor for providing a voltage waveform thereacross which increases and decreases with respect to time, which includes regulators for precisely controlling the voltage during various time periods.

In an eight cylinder engine, two banks of four fuel injector valves each may be utilized to supply fuel to the cylinders. The time during which a bank of injector valves is opened controls the amount of fuel supplied and should be varied with the speed of the engine. The present invention utilizes an electronic circuit, primarily an IC chip, to switch between the two banks of injector valves and to control the time during which a bank of injector valves is open. The circuit includes a storage capacitor for each bank of valves, and transistorized regulating circuits to change the voltage across the capacitor, with the circuits providing different voltages at different points in time. During one period of rotation of the engine, which is the exhaust stroke, the capacitor is charged to provide thereacross a complex voltage waveform which varies with time, but is independent of the speed of rotation. The capacitor is then charged to provide a ramp operating voltage starting at the time the engine has completed the exhaust stroke. This ramp, which is developed during the following period of rotation, which is the power stroke of the engine starts at a voltage which depends on the voltage across the capacitor at the time the power stroke starts.

The injector valves are opened at the time the ramp operating voltage is initiated, which is at a defined point of rotation. The valves will remain open until the voltage across the capacitor produced by the waveform with the ramp operating voltage added thereto has a predetermined relation to a voltage responsive to manifold pressure in the engine. Consequently, the voltage of the waveform, which depends upon time, will control the length of time during which the injector valves are open.

At the time when the ramp operating voltage is initiated at one capacitor, the circuit which provides the waveform is switched to the second capacitor. Therefore, the waveform is developed alternately across each capacitor during the rotation period prior to the production of the ramp operating voltage thereacross, which also occurs alternately across each capacitor. Since the ramp operating voltage is applied at a time dependent upon the rotation of the engine, and the waveform is independent of the rotation of the engine, the ramp will be initiated at various different points on the waveform, depending upon engine speed. When the ramp operating voltage is initiated, the production of the waveform across the capacitor is terminated and the remainder of the waveform will not be produced.

DETAILED DESCRIPTION

Figure 1:
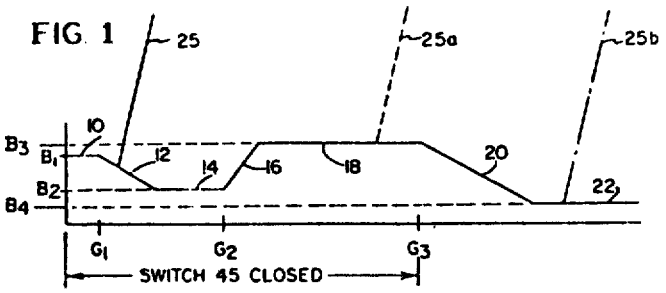
FIG. 1 shows the waveform which is developed by the regulator circuit of the invention.

FIG. 1 illustrates a wave shape which is desirable for use in properly controlling the time during which the injector valves are open in a fuel injection system. The waveform shown represents the voltage across a capacitor which is used as the starting voltage of an operating voltage ramp developed across the capacitor. The fuel injector valves are open at the time the ramp starts, and the ramp voltage is compared with a voltage resulting from manifold pressure, and/or other engine characteristics to turn off the valves at the proper time.

The waveform in FIG. 1 has a first constant voltage portion 10 during which a voltage B1 is provided across the capacitor, which lasts for a short period, such as 3 milliseconds. At the end of this period, at time G1, a down ramp 12 reduces the voltage across the capacitor to a lower value B2, to provide a second lower constant voltage portion 14 of the waveform. This portion continues until the time G2, which may be about 20 milliseconds after the start time. At this time an up ramp 16 is initiated which continues until the voltage B3 is reached. This voltage is held until the time G3 to provide the third fixed voltage portion of the waveform, indicated as 18. The time G3 may be of the order of 60 milliseconds after the start time. At time G3, a second down ramp is provided, indicated on the waveform as 20. This extends for a longer period and drops to a lower value B4, to provide the fourth fixed voltage portion, which is indicated at 22.

The voltage values and time durations shown in FIG. 1, and which have been described, are independent of the speed of rotation of the engine. The particular values of voltage and time can be selected as may be required for a particular application and the system can be used to produce a wave shape different from that shown.

For the fuel injection system, at a particular point in the rotation of the engine the capacitor is charged to provide the waveform shown, and at a further point in the rotation an up ramp 25 is developed across the capacitor. This may occur at any time after about 3 milliseconds after start of the rotation period, depending upon the speed of the engine. The ramp 25 is illustrated as starting shortly after the time G1, as would occur during extremely high speed operation. A second ramp 25a (dashed line) is shown which represents operation at some intermediate speed, and the ramp 25b (dot-dash line), which is initiated during the portion 22 of the waveform, represents operation at very slow or idling engine speed. As previously stated, the point along ramp 25 at which the valve closes depends upon the manifold pressure and is not a constant voltage under all conditions. At the time the ramp 25 starts, the circuit for producing the waveform is disconnected from the capacitor so that the waveform generation is terminated. If the ramp 25 starts during the portion 12 of the waveform, the remainder of the waveform is not generated. At the start of the ramp 25, a new waveform is generated on the second capacitor to produce the same voltages at the times G1, G2 and G3, as will be explained.

Figure 2:
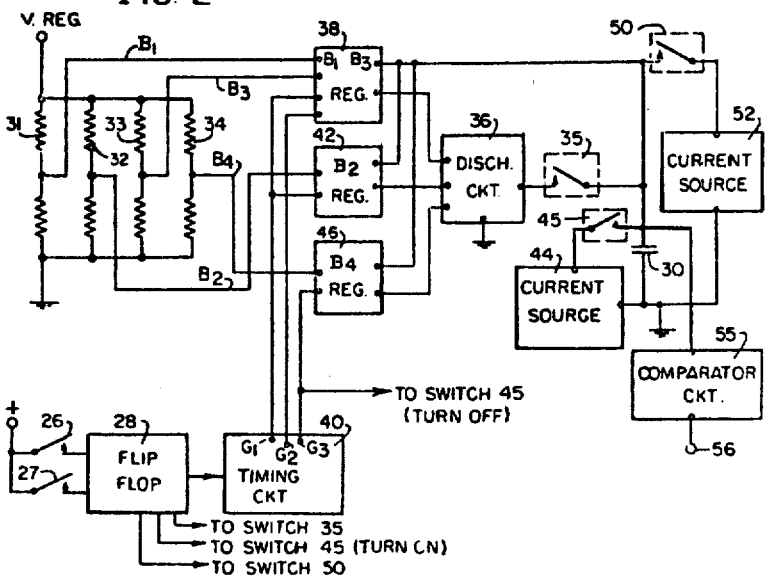
FIG. 2 is a block diagram of the regulator system of the invention.

In FIG. 2 there is shown schematically the system of the invention for providing the waveform illustrated in FIG. 1 across a capacitor 30. Four voltage dividers 31, 32, 33 and 34 are shown for providing the voltages B1, B2, B3 and B4, respectively. The alternate cycles are triggered by switches 26 and 27 which control the flip-flop circuit 28. The switches may be coupled to the distributor shaft of the engine and be operated at the 0° and 180° positions of this shaft, respectively. As the distributor shaft rotates through 180° for each full revolution of the crankshaft, the crankshaft rotates through a full revolution between switch operations. The revolution following the operation of one switch 26 is the power stroke for some cylinders, and the revolution following the operation of the next switch 27 is the exhaust stroke for these cylinders.

At the start of the cycle providing the exhaust stroke, capacitor 30 will be charged to a high value by current applied by source 52 through switch 50, which produced the ramp 25 during the preceding cycle. At the beginning of the cycle, switch 35 is closed to connect discharge circuit 36 to the capacitor 30, and switch 50 is opened to disconnect current source 52. In addition, switch 45 is closed to connect current source 44 to capacitor 30. The operation of the switches 35, 45 and 50 is controlled by the flip-flop 28. The capacitor 30 will initially discharge (since the discharge current is greater than the current from current source 44) until it reaches the B1 voltage level under control of the B1, B3 voltage regulator 38. This regulator initially responds to the voltage divider 31 to hold the charge on capacitor 30 accurately at the B1 level by shunting the source current from circuit 44 through the discharge circuit 36, allowing zero current to be drawn out of the capacitor.

The capacitor 30 will be held at the B1 level until the timing circuit provides a control at terminal G1 representing the time G1 in FIG. 1. At time G1, the control from the timing circuit 40 applied to regulator 38 will remove the control from voltage B1, and control is transferred to regulator 42 to provide control from the B2 reference. The discharge circuit 36 is also activated by the regulator 38 at time G1 and causes the voltage across the capacitor 30 to reduce to provide the down ramp 12, until the voltage B2 is reached. The discharge current is then satisfied by current from the B2 regulator allowing no more current to be drawn from the capacitor. The voltage is then held at the fixed voltage B2 forming the portion 14 of the waveform.

The B2 voltage continues until time G2, at which time the timing circuit 40 applies a potential to regulator 38 to cause the same to operate from the B3 voltage. At the same time the B2 regulator becomes inactive and the discharge circuit 36 draws no current from the capacitor 30. The voltage across the capacitor 30 increases as a result of the charging current from current source 44 to provide the ramp 16, until the B3 voltage is reached. At this time the regulator 38 will cause the discharge circuit 36 to operate so that current which is supplied by the source 44 is shunted from capacitor 30, and capacitor 30 is held precisely at the fixed B3 voltage until the time G3.

At the time G3, the timing circuit 40 applies a potential to the switch 45 to disconnect the current source 44 so that current is no longer supplied to the capacitor 30 thereby. This control potential is also applied to regulator 46 which causes the discharge circuit 36 to discharge capacitor 30 and provide the down ramp 20. This continues until the voltage drops to the B4 level, at which point the regulator 46 operates to hold the capacitor 30 accurately at this level. Regulator 46 will precisely control the discharge circuit 36 so that no current is drawn from capacitor 30.

As previously stated, capacitor 30 is charged to provide an operating ramp at some time during the production of the waveform thereacross, depending upon the speed of the engine. The flip-flop 28 actuates switches 35 and 45 and applies a reset signal to the timing circuit 40 when the engine is at one point to initiate the waveform across capacitor 30, and at the next point in the engine operation operates switch 50 to initiate the ramp. That is, switches 35 and 45 are opened, and switch 50 is closed to connect the current source 52 to the capacitor 30 to apply current to the same to provide the ramp which is illustrated as 25 in FIG. 1. As previously stated, this may occur at any point along the waveform after 3 milliseconds. The voltage across capacitor 30 may be applied to a comparator circuit 55 which compares this voltage with a voltage from the engine applied at terminal 56, such as a voltage related to manifold pressure. At the next engine position, all switches change state to produce the waveform of FIG. 1, as previously explained.

At each time when switch 26 or 27 is operated, the timing circuit 40 will be reset to start a new series of time periods G1, G2, and G3. As will be explained, the waveform generating circuitry will be switched to another capacitor at the time that the operating ramp is applied to the capacitor 30. Accordingly, the regulators will not be operative to effect the voltage across capacitor 30 during the time that the current source 52 is connected thereto to provide the operating ramp.

Figure 3:
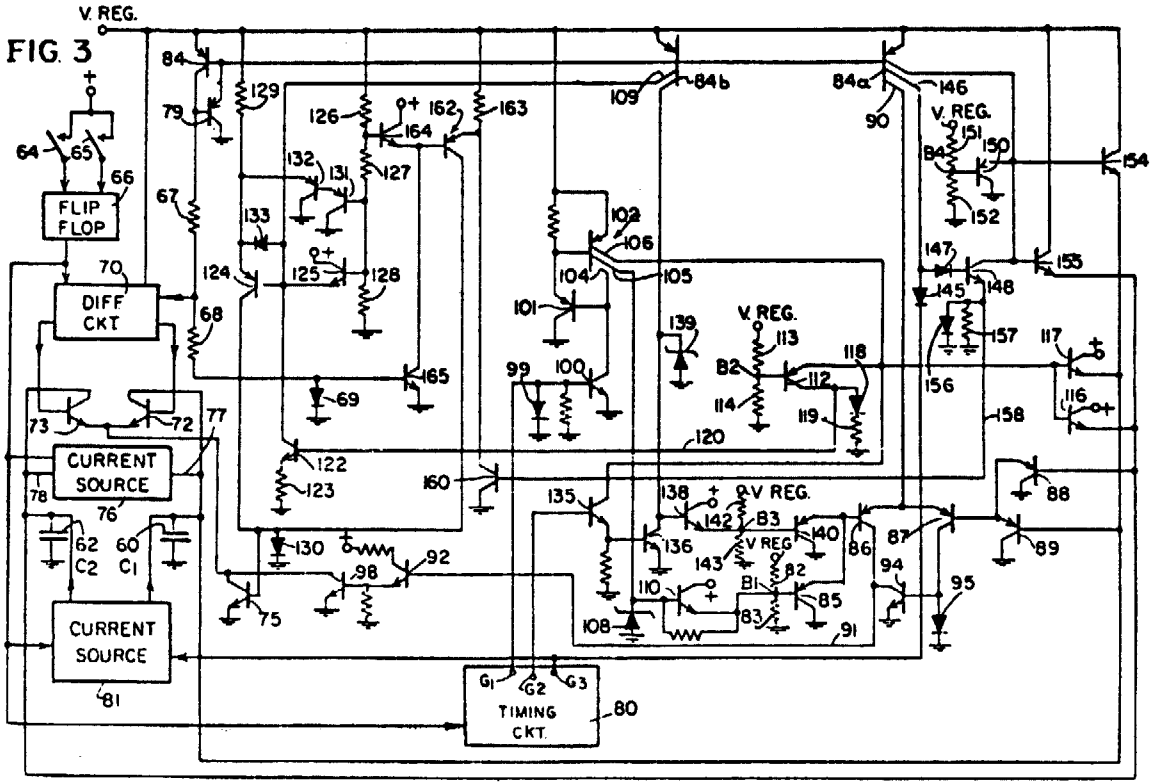
FIG. 3 is a circuit diagram of the system illustrated in FIG. 2.

The complete circuit of the injector valve control system is shown in FIG. 3, and includes two capacitors C1 and C2 across which the waveform shown in FIG. 1 is developed, each having this waveform developed thereacross during alternate periods of rotation of the engine. At the end of one engine period, during which one capacitor has been charged to produce the waveform thereacross, the operating ramp is developed across this capacitor to control the time during which half of the injector valves are open. During this operating period for the one capacitor, the second capacitor is being charged so that the waveform shown in FIG. 1 is developed thereacross. The capacitor C1 will be designated by reference numeral 60, and capacitor C2 will be designated by reference numeral 62. The cycle will be described for developing the waveform across capacitor 60, and the cycle for the other capacitor 62 is the same but with the waveform and operating parts at alternate time periods.

Switches 64 and 65 shown in FIG. 3 may be reed switches coupled to the engine to operate at alternate 0° and 180° rotation points of the distributor shaft (full revolutions of the crankshaft). These may provide momentary contacts and are coupled to flip-flop circuit 66 which serves as a memory to record which switch was last operated. Circuit 66 produces an output which will have one value during one revolution of the engine and a different value during the following revolution. The flip-flop 66 controls differential circuit 70 which selectively renders transistors 72 and 73 conducting. Transistor 72 has its collector electrode connected to the high potential side of capacitor 60 and its emitter electrode connected through current source transistor 75 to the reference potential. Transistor 73 is connected in the same way to capacitor 62.

A reference potential is provided for the differential circuit 70 by the voltage divider including resistors 67 and 68, and diode 69, which are connected from the collector of the current source transistor 84 to ground. The voltage from the flip-flop 66 is applied against the reference voltage provided by the divider, so that the differential circuit 70 switches as the value of the output of flip-flop 66 changes from one level to another.

The current source transistor 84 is illustrated in the diagram as three transistors 84, 84a and 84b, with the emitter and base electrodes tied together. This can actually be a single transistor structure with a single base and emitter, and with a plurality of collectors. The conductivity of the transistor 84 is controlled by the current flow through resistors 67 and 68, by action of transistor 79.

The flip-flop circuit 66 is also connected to the current source 76, the current source 81, and the timing circuit 80. The timing circuit 80 produces three time periods G1, G2 and G3, which are initiated at each change in the output from the flip-flop 66 corresponding to each operation of switch 64 and of switch 65. As previously stated, the time periods G1, G2 and G3 are independent of the engine operation, and the sequence is started at each 180° rotation point of the distributor shaft.

The output of the flip-flop 66 which is connected to the current source 76 controls the operating ramp indicated as 25 in FIG. 1. This is started at each change in the output of the flip-flop 66, and is alternately applied to the two capacitors 60 and 62. The current source 76 includes switching means for controlling the output to alternately apply the current to conductor 77 connected to capacitor 60, and to conductor 78 connected to capacitor 62, dependent upon the state of the flip-flop 66.

At the time the differential circuit 70 is operated to provide a connection to capacitor 60 (or capacitor 62), this capacitor is at its largest value of voltage, since during the previous half cycle it has been charged to produce the operating ramp 25. At this same time, current source 81 is connected to supply current to the capacitor connected to the differential transistor 72 or 73 which is conducting. This control of the current source 81 is also supplied by the flip-flop 66. When transistor 72 is rendered conducting, this transistor completes a circuit from capacitor 60 to the collector of transistors 75 and 98 which are connected in parallel. The transistors 75 and 98 are never simultaneously conducting and when either transistor 75 or transistor 98 conducts, a path is completed for capacitor 60 to discharge current to ground.

The voltage divider including resistors 82 and 83, connected between the regulated voltage and ground establishes the voltage B1 to which the capacitor 60 is to be initially charged. This voltage renders transistor 85 conducting to apply the voltage to the base of transistor 86 which cooperates with transistor 87 to form a differential amplifier. Capacitor 60 is connected to the differential amplifier transistor 87 by transistor 89. Since the capacitor 60 is at a high voltage, transistor 86 of the differential amplifier will be fully conducting to provide current from the collector 90 of source transistor 84a. This current will flow mainly through conductor 91 to render transistor 92 conducting. Transistor 94, which is connected in series with transistor 86 to ground, will be controlled by the current through diode 95 connected in series with transistor 87 to ground. As transistor 87 is cut off by the voltage from capacitor 60, little or no current flows through diode 95, and this will cut off transistor 94, so that the current from transistor 86 will flow through transistor 92. Transistor 92 acts to render transistor 98 highly conducting to provide a path for discharge of the capacitor 60 through transistor 72.

Capacitor 60 will, therefore, discharge rapidly and when it reaches the voltage B1, it will result in the balancing of the differential amplifier including transistors 86 and 87, to thereby reduce the conduction of transistors 92 and 98 to effectively open the discharge path. In the event that the capacitor 60 discharges below the value B1, this will render transistor 87 of the differential amplifier conducting such that it causes diode 95 to conduct, as well as transistor 94. This eliminates the drive to the base of transistor 92, which in turn terminates conduction of transistor 98. As a result, the charging current which is being supplied by current source 81 raises the voltage on the capacitor 60 to the B1 potential. Accordingly, the regulator including differential amplifier 86, 87 and the voltage divider 82, 83, in cooperation with the current source 81, controls the voltage on capacitor 60 to hold the same at the B1 level.

At time G1, the timing circuit 80 applies a current from terminal G1 through diode 99 to ground. This causes transistor 100 to conduct collector current of the same value as that from the G1 terminal. This will turn on transistor 101 which, in turn, renders transistor 102 conducting. Transistor 102 forms a current source and has three collectors designated 104, 105 and 106. Collector 104 is connected to the base of transistor 101 to provide feedback action such that the collector current of transistor 100 is approximately the same as the current in collector 104. In addition, the currents in collectors 105 and 106 of transistor 102 are identical to that in collector 104. Collector 105 is connected to the zener diode 108, connected between the base of transistor 110 and ground. When transistor 102 conducts, this supplies current to the zener diode which renders transistor 110 conducting. This lifts the voltage applied to the base of transistor 85 to a high value so the transistor 85 has no control of the differential amplifier 86, 87. This terminates the control from the B1 voltage divider.

The collector 106 of transistor 102 is connected to the emitter of transistor 112 and when transistor 102 is rendered conducting at time G1, this also renders transistor 112 conducting. The base of transistor 112 is connected to the voltage divider including resistors 113 and 114, which are connected from the regulated voltage to ground. This divider provides the B2 voltage level, which is coupled to the base of transistor 112. The emitter of transistor 112 is also connected to the bases of emitter follower transistors 116 and 117, which are in turn connected to the capacitors 60 and 62, respectively. Connected in the collector circuit of transistor 112 is a diode 118 in series with resistor 119. The voltage across diode 118 and resistor 119 is applied through conductor 120 to the base of transistor 122. Transistor 122 is in a circuit for controlling transistor 75 which is connected in series with transistor 72 to capacitor 60.

The collector current of transistor 122, which is determined by the ratio of resistor 119 to resistor 123, controls the conductivity of transistor 124, which is a PNP transistor and has its base connected to the emitter of NPN transistor 125. This collector current must be greater than the current from collector 109 of transistor 84b to insure conduction of transistors 124 and 125. The voltage divider string including resistors 126, 127 and 128 applies a regulated potential to the base of transistor 125 which may have a value of about 3 volts. When transistor 122 is conducting, it supplies base current to transistor 124 to render the same conducting in accordance with the potential applied to its base from transistor 125. transistor 124 completes a path through resistor 129 and diode 130 to provide a potential across diode 130 which is applied to the base of transistor 75. This renders transistor 75 conductive to complete a discharge path for capacitor 60.

The value of the current in the collector of transistor 72 is determined by the voltage across resistor 129 and the resistance value itself. The voltage across this resistor is essentially the same as the voltage at the base of transistor 125, since the base-emitter voltage drop of transistor 125, cancels the base-emitter voltage drop of transistor 124. The value of the discharge current is equal to the current from source 81 minus the current in collector of transistor 72.

Capacitor 60 will then discharge, as shown by ramp 12, in FIG. 1, until it reaches the voltage B2, at which time transistor 117 will conduct (transistor 116 if dealing with capacitor 62) to hold the voltage at the B2 value. This occurs since the base-emitter voltage of transistors 112 and 117 cancel, and transistor 117 supplies the current demanded at the capacitor to allow the discharge current from the capacitor to go to zero. In the event that capacitor 60 discharges below the B2 value, emitter follower transistor 117 will be rendered more conducting to supply current from the B+ supply to force the capacitor back to the B2 value. Accordingly, transistor 117 in cooperation with transistor 112 and the voltage divider acts as a regulator to hold the voltage across capacitor 60 at the B2 level, which continues until time G2 as represented by level 14 in FIG. 1.

At the time G2, a current is applied from terminal G2 of timing circuit 80 to the base of transistor 135. Transistor 135 will conduct to render transistor 136 conducting to turn off transistor 138. At this point it is noted that transistor 138 is normally conducting since current is supplied from a collector of current source transistor 84b to the zener diode 139. This zener diode develops a voltage which is applied to the base of transistor 138 to render the same conducting and lift the voltage applied to the base of transistor 140 to a high value. Accordingly, transistor 140 is normally at a value such that it has no effect on the differential amplifier formed by transistors 86 and 87 when transistor 110 is not conducting. When transistor 138 is cut off, the voltage divider formed by resistors 142 and 143 connected between the regulated voltage and ground now controls the voltage applied to the base of transistor 140.

The B3 voltage from the voltage divider 142, 143 at the base of transistor 140 now controls the differential amplifier 86, 87 which is again coupled to the capacitor 60 by transistor 89 (and to capacitor 62 by transistor 88), as previously described. In view of the fact that transistor 135 is also conducting, its collector current satisfies the current out of collector 106 of transistor 102 and pulls the voltage at the emitter of transistor 112 down such that transistors 112, 117, and 116 will not conduct. Accordingly, the B2 voltage no longer controls the voltage across the capacitor 60. In addition, the current through diode 118 is reduced to zero and as a result, the collector current of transistor 122 is reduced to zero. Current from collector 109 of transistor 84b now flows through diode 133, which forces a reverse bias on the base-emitter junction of transistor 124. This causes transistor 124 to turn to off to turn off transistor 75, terminating the current through the collector of transistor 72. The current through diode 133 passes to ground through transistor 132 so that transistors 131, 132, and diode 133 clamp the voltage at the base of transistor 124 to three base-emitter drops above the voltage at the junction of resistors 127 and 128. This prevents the collector 109 from saturating, which would cause detrimental effects to the remaining circuitry.

In the absence of collector current from transistor 72, the current source 81 provides current to capacitor 60 (or 62) to charge the same starting at time G2 to produce the up ramp portion 16 of the waveform shown in FIG. 1. As previously stated, the current source 81 is also connected to the flip-flop circuit 66 so that it applies current only to the capacitor on which the waveform is being developed, which is capacitor 60 in the operation being described. The current source 81 can be set, in known manner, to charge capacitor 60 to provide the desired slope of the ramp portion 16. The current source 81 continues operating during the period from the beginning of the waveform generation to time G3, and is turned off at time G3 by the connection from the G3 output of the timing circuit 80.

When the voltage across capacitor 60 reaches the B3 voltage level, the differential amplifer 86, 87 will become balanced. As the voltage across capacitor 60 tends to rise above the B3 level, transistor 86 will be rendered conducting to apply current through conductor 91 to transistor 92 which turns on transistor 98, as previously described. This provides a path for shunting the current from source 81 applied to capacitor 60 through transistors 72 and 98. Accordingly, although the current source 81 continues to supply current to the capacitor 60 through the entire period from time G2 to G3, when the B3 voltage level is reached across capacitor 60, the current path is completed through transistors 72 and 98 to conduct the charging current so that capacitor 60 remains at the B3 voltage level, receiving no more charging current. This produces the fixed voltage portion 18 of the waveform shown in FIG. 1. As previously stated, the regulator including the differential amplifier 86, 87 and the voltage reference 142, 143 controls the voltage across capacitor 60 to hold the same precisely at the desired B3 voltage level.

The voltage across capacitor 60 remains at the B3 level until time G3. At this time, the timing circuit 80 provides a ground at the terminal G3 which is connected to current source 81 to render the same inoperative to supply current to capacitor 60. The ground at terminal G3 also completes a path through diode 145 to the collector 146 of current source transistor 84a. The current through diode 145 diverts current from the path through the diode 147 to the base of transistor 148, and acts to turn off transistor 148. The conduction of transistor 148 prior to time G3 has held transistor 150, 154 and 155 turned off. This insures that the B4 voltage level established by resistors 151 and 152 from $V_{reg}$ to ground, does not control the voltage on the capacitor 60 (or 62). Now when transistor 148 turns off, transistors 150 and 154 (or 155 for capacitor 62) are rendered conducting, and are in a condition to apply the B4 potential from the voltage divider including resistors 151 and 152 to capacitor 60.

Transistor 148 when conducting also produces a voltage across diode 156 and resistor 157, connected between the emitter of transistor 148 and ground. This voltage is applied through conductor 158 to the base of transistor 160 and acts to hold transistor 160 conducting. This produces a voltage drop across resistor 163 which reverse biases the emitter-base junction of transistor 162 rendering it non-conducting. Now at time G3 when transistor 148 is turned off, the positive potential is removed from the base of transistor 160 so that it turns off. This removes the clamp applied to the emitter of transistor 162 which is connected through resistor 163 to the regulated voltage. The base of transistor 162 is connected to the emitter of transistor 164, the base of which is connected to the voltage divider string including resistors 126, 127 and 128. The base of transistor 162 is also connected to the collector of transistor 165, having its base connected across diode 69 in the voltage divider string including resistors 67, 68 and transistor 84. Transistor 165 supplies base current for transistor 162 so that transistors 162 and 164 are rendered conducting, and the base of transistor 162 is held at the potential applied thereto from transistor 164 connected to the voltage divider. Because of the voltage cancellation of the base-emitter junctions of transistors 164 and 162, the voltage at the emitter of transistor 162 is the same as the voltage at the base of transistor 164. This voltage and the value of resistor 163 will determine the amount of conduction of transistor 162.

The conduction of transistor 162 will cause current flow through diode 130 to turn on transistor 75 to complete the path through transistor 72, as previously described. Accordingly, at time G3, capacitor 60 will discharge through transistors 72 and 75 until the voltage thereacross reaches the B4 level. If capacitor 60 falls below the B4 level, emitter follower transistor 154 will be rendered conducting to supply current to capacitor 60 until the B4 voltage value is reached. Transistor 154 essentially supplies the current cemanded by the collector of transistor 72 and thus this collector draws no current from capacitor 60. Accordingly, transistors 150 and 154, and the voltage divider 151, 152 act as a regulator to hold the voltage across capacitor 60 at the B4 voltage level during the portion 22 of the waveform of FIG. 1.

As previously stated, the current source 76 will be rendered operative to apply regulated current to either conductor 77 or 78 depending upon the condition of the flip-flop 66. Accordingly, as the output of the flip-flop changes, the capacitor on which the waveform has been developed, capacitor 60 in the prior description, will now be disconnected from the circuit which provides the waveform, as transistor 72 will be rendered nonconducting by the differential circuit 70. At this same time the current source 76 will provide the operating ramp across this capacitor. The current source 76 may be as described in application Ser. No. 189,521 filed Oct. 15, 1971, assigned to the assignee of the present application.

During the time that the operating ramp is being developed across capacitor 60, the waveform as shown in FIG. 1 will be developed across capacitor 62. The operation is the same as has been described, except that transistors 88, 116 and 155 which are connected to capacitor 62 will now be operative to regulate the voltage on this capacitor, while transistors 89, 117 and 154 are inoperative. Transistors 88, 116, and 155 were inoperative when the waveform was generated on capacitor 60 because the voltage on capacitor 62 was at some high ramp 25 voltage, such as that shown in FIG. 1. This forces all of the base-emitter junctions of these transistors to be reversed biased and thus renders them nonconducting. Also, the discharging action on capacitor 62 will be through transistor 73 and either of transistor 75 or transistor 98, depending upon the particular portion of the waveform which is being produced. The current source 81 will be connected to supply current to capacitor 62 rather than capacitor 60, to provide the up ramp 16 in the waveform.

The circuit of the invention has been found to provide the voltage waveform described with extremely high accuracy, the accuracy being within one percent over a temperature range from −50° F. to +135° F. This is possible by making various of the transistors, such as transistors 86 and 87 of the differential amplifier, substantially identical, which can be accomplished by constructing the circuit as an integrated circuit on a semiconductor chip. Further, during the operation of the circuit, the voltages do not depend on a charge being held on a capacitor, because the voltages are always controlled from reference voltages produced by the voltage dividers, and the regulator circuits hold the voltages across the capacitors at the required values.

The circuit of the invention when provided as an integrated circuit chip forms a compact and inexpensive unit. The voltage dividers can be external to the chip so that the voltage levels can be independently set as desired. Also, the resistors 126 and 163 can be external to the chip allowing the ramps 12 and 20 of FIG. 1 to also be determined. External components can be provided for current sources 81 and 76 to allow complete adjustment of every portion of the waveform including the B levels, the slope of each ramp, and the breakpoints (G1, G2, G3). By making such components external, it is still possible to use an integrated circuit construction having a reasonable number of terminals for connection to external components.

We claim:

1. A circuit for developing across a capacitor a waveform having a plurality of different voltage levels at least one of which is greater than the preceding level and at least one of which is less than the preceding level, such circuit including in combination, reference means providing a plurality of reference voltages representing the different voltage levels of the waveform, regulator means coupled to said reference means and to the capacitor for selectively holding the voltage thereacross at a value associated with one of the reference voltages, *said regulator means including a differential amplifier,* discharge circuit means connected to the capacitor and to said regulator means and adapted to be rendered operative by said regulator means to discharge the capacitor and reduce the voltage thereacross until a selected one of the voltage levels is reached, and current source means connected to the capacitor and adapted to operate to supply current thereto to increase the voltage thereacross until another one of the voltage levels is reached.

2. The circuit of claim 1 further including timing means coupled to said regulator means and to said current source means for rendering the same operative in a predetermined time relation.

3. A circuit in accordance with claim 2 wherein said timing means caues said regulator means to control the voltage across the capacitor at a first level in response to a first reference voltage and thereafter applies a control potential to said regulator means to control the voltage across the capacitor at a second level in response to a second reference voltage.

4. A circuit in accordance with claim 2 wherein said [regulator means includes a] differential amplifier *is* connected to the capacitor and responsive to a voltage on the capacitor above the first voltage level to control said discharge circuit to discharge the capacitor to the first voltage level, said differential amplifier being responsive to a first reference voltage to hold the voltage across the capacitor at the first voltage level, and wherein said timing means deactivates said discharge circuitry to allow said current source to charge the capacitor so that the voltage thereacross increases to a second voltage level, said timing means controlling said regulator means so that said differential amplifier responds to a second reference voltage and operates said discharge circuit to prevent charge of the capacitor above the second voltage level so that the voltage across the capacitor is held at the second voltage level.

5. A circuit in accordance with claim 2 wherein said regulator means includes an emitter follower circuit connected between said reference means and the capacitor and responsive to the voltage on the capacitor, said timing means controlling said regulator means so that said emitter follower circuit responds to a first reference voltage and actuates said discharge circuit means to discharge the capacitor so that the voltage thereacross decreases to the first voltage level, said emitter follower operating to hold the voltage across the capacitor at said first voltage level.

6. A circuit in accordance with claim 2 wherein said regulator means initially responds to a first reference voltage and operates said [dischagge] *discharge* circuit means to cause the capacitor to discharge to a first voltage level related to said first reference voltage, said timing means applying a first control signal to said regulator means to cause the same to operate in response to a second reference voltage and to cause said discharge circuit to discharge the capacitor so that the voltage thereacross drops to a second voltage level related to said second reference voltage, said timing means applying a second control signal to said regulator means to control said discharge circuit so that said current source means charges the capacitor so that the voltage thereacross rises from the second voltage level to a third voltage level, with said regulator means being responsive to a third reference voltage to operate said discharge circuit means so that the voltage across the capacitor does not rise above the third voltage level, and said timing means applying a third control signal to said current source means and to said regulator means to render said current source means inoperative and cause said regulator means to respond to a fourth reference potential and to operate said discharge circuit means to discharge the capacitor so that the voltage thereacross drops from the third voltage level to a fourth voltage level, said regulator means acting to hold the voltage across the capacitor at each voltage level until a further control signal is received.

7. A circuit in accordance with claim 1 wherein said discharge circuit means includes first and second portions selectively coupled to the capacitor for discharging the same, and said regulator means includes first and second portions coupled respectively to said first and second portions of said discharge circuit means, said first portion of said regulator means responding to a first reference voltage to operate said first portion of said discharge circuit means, and said second portion of said regulator means responding to a second reference voltage to operate said second portion of said discharge circuit means.

8. The circuit of claim 1 wherein said current source means is selectively operated to charge the capacitor to provide a voltage ramp superimposed on the voltage waveform thereacross, and further including trigger means coupled to said regulator means and to said current source means for controlling the initiation of the waveform across the capacitor and the initiation of the voltage ramp, and means coupled to the capacitor for providing a control in reponse to the superimposed voltage across the capacitor.

9. A circuit in accordance with claim 8 wherein said current source means includes first and second current supply means selectively connected to said capacitor means, said regulator means includes control means for selectively rendering said regulator means responsive to different ones of said reference voltages, and further including timing means coupled to said regulator means and to said first current supply means, said regulator means being initially responsive to a first reference voltage and operating said discharge circuit means to cause said capacitor means to discharge to a first voltage level related to said first reference voltage, and wherein said timing means applies a first control signal to said control means to cause said regulator means to operate in response to a second reference voltage and to cause said discharge circuit to discharge said capacitor means so that the voltage thereacross drops to a second voltage level related to said second reference voltage, said timing means applying a second control signal to said control means at a time following the first control signal to operate said discharge circuit means so that said first current supply means charges said capacitor means so that the voltage thereacross rises from the second voltage level to a third voltage level, said regulator means being rendered responsive to a third reference voltage to operate said discharge circuit means so that the voltage across said capacitor means does not rise above the third voltage level, and said timing means applying a third control signal to said first current supply means and to said control means at a time following the second control signal to render said first current supply means inoperative and cause said regulator means to respond to a fourth reference potential and to operate said discharge circuit means to discharge said capacitor means so that the voltage thereacross drops from the third voltage level to a fourth voltage level, with the waveform across the capacitor including said first, second, third and fourth voltage levels, and trigger means interrupting the waveform and causing said second current supply means to charge the capacitor to provide the voltage ramp superimposed on the voltage waveform across the capacitor at the time of interruption.

10. A circuit in accordance with claim 9 wherein said [regulator means includes a] differential amplifier *is* connected to said capacitor means and said discharge circuit means includes first and second portions, said differential amplifier being responsive to a voltage on said capacitor means above the first voltage level to control said first portion of said discharge circuit means to discharge said capacitor means to the first voltage level, said differential amplifier being responsive to a first reference voltage to hold the voltage across said capacitor means at the first voltage level, wherein said control means responds to said first control signal from said timing means to cause said regulator means to control said second portion of said discharge circuit means to discharge said capacitor means so that the voltage thereacross drops from said first voltage level to said second voltage level, wherein said control means responds to said second control signal from said timing means to actuate said regulator means so that said differential amplifier responds to said third reference voltage and operates said first portion of said discharge circuit means to prevent further charge of said capacitor means by said first current supply means so that the voltage thereacross does not rise above the third voltage level, and wherein said control means responds to said third control signal from said timing means to cause said first current supply means to be inoperative and to cause said regulator means to control said second portion of said discharge circuit means to discharge said capacitor means so that the voltage thereacross drops from said third voltage level to said fourth voltage level.

11. A circuit for producing a predetermined voltage wave having a plurality of different voltage levels, at least one of which is greater than the preceding level and at least one of which is less than the preceding level, such circuit including in combination, capacitor means, reference means providing a plurality of reference voltage presenting the different voltage levels of the voltage wave, regulator means coupled to said reference voltage and to said capacitor means for selectively holding the voltage thereacross at a value associated with one of the reference voltages, *said regulator means including a differential amplifer,* current source means connected to said capacitor means to supply current to said capacitor means to charge the same, and discharge circuit means connected to said capacitor means and to said regulator means and adapted to be rendered operative by said regulator means to discharge said capacitor means and to reduce the voltage thereacross until a selected one of said different voltage levels is reached, said discharge circuit means being controlled so that said current source means charges said capacitor means to increase the voltage thereacross until another one of the voltage levels, which is greater than the preceding level, is reached.

12. The circuit of claim 11 wherein said regulator means includes control means for selectively rendering the same responsive to different ones of said reference voltages, and said regulator means is operative to hold the voltage across said capacitor means at a value related to one of said reference voltages until said control means operates to render said regulator means responsive to a different reference voltage.

13. A circuit in accordance with claim 11 wherein said regulator means includes control means for selectively rendering the same responsive to different ones of said reference voltage, said regulator means being initially responsive to a first reference voltage and operating said discharge circuit means to cause said capacitor means to discharge to a first voltage level related to said first reference voltage, and further including timing means coupled to said control means and to said current source means, said timing means applying a first control signal to said control means to cause said regulator means to operate in response to a second reference voltage and to cause said discharge circuit means to discharge said capacitor means so that the voltage thereacross drops to a second voltage level related to said second reference voltage, said timing means applying a second control signal to said control means to control said discharge circuit means so that said current source means charges said capacitor means so that the voltage thereacross rises from the second voltage level to a third voltage level, said regulator means being rendered responsive to a third reference voltage to operate said discharge circuit means so that the voltage across said capacitor means does not rise above the third voltage level, and said timing means applying a third control signal to said current source means and to said regulator means to render said current source inoperative, and to cause said regulator means to respond to a fourth reference potential and to operate said discharge circuit means to discharge said capacitor means so that the voltage thereacross drops from the third voltage level to a fourth voltage level.

14. A circuit in accordance with claim 13 wherein said discharge circuit means includes a first portion which causes said capacitor means to discharge to said first voltage level and which operates to prevent the voltage across said capacitor means from rising above said third voltage level, and a second portion which causes said capacitor means to discharge so that the voltage thereacross drops from said first voltage level to said second voltage level and to discharge so that the voltage thereacross drops from said third voltage level to said fourth voltage level.

15. A circuit in accordance with claim 13 wherein said [regulator means includes a] differential amplifier *is* connected to said capacitor means and responsive to a voltage on said capacitor means above the first voltage level to control said discharge circuit means to discharge said capacitor means to the first voltage level, said differential amplifier being responsive to a first reference voltage to hold the voltage across said capacitor means at the first voltage level, and wherein said second control signal from said timing means actuates said regulator means so that said differential amplifier responds to said third reference voltage and operates said discharge circuit means to prevent charge of said capacitor means by said current source means so that the voltage thereacross rises above the third voltage level, whereby the voltage across said capacitor means is held at the third voltage level.

16. The circuit of claim 13 wherein said capacitor means includes first and second capacitors and wherein said regulator means, said discharge circuit means and said current source means are selectively coupled to said first capacitor to provide the voltage wave thereacross during a first cycle, and are connected to said second capacitor to provide the voltage wave thereacross during a second cycle.

17. A circuit in accordance with claim 16 further including ramp current means and means for selectively coupling said ramp current means to said first and second capacitors to provide a ramp voltage superimposed on the voltage wave across said first capacitor during the second cycle, and to provide a ramp voltage superimposed on the voltage wave across said second capacitor during a third cycle.

*18. A circuit in accordance with claim 1 wherein said regulator means includes:*

*current supply means;*

*said differential amplifier having differentially connected first and second electron control means each having first, second and control electrodes, said first and second electron control means having commonly connected first electrodes which are coupled to said current supply means; and*

*differential-to-single ended converter means coupled between said second electrodes of said differentially connected first and second electron control means, and said discharge circuit means.*

*19. A circuit in accordance with claim 18 wherein said first and second electron control means each include at least one transistor.*

*20. A circuit in accordance with claim 18 further having a selecting circuit for controlling which of a plurality of reference voltages of different potentials is applied to the control electrode of one of said differentially connected electron control means, the selecting circuit including:*

*first transistor means having a control electrode adapted to receive one of the reference voltages, a first electrode connected to said control electrode of said one of said differentially connected electron control means, and a second electrode coupled to receive a predetermined power supply potential; and*

*second transistor means having a control electrode adapted to receive another of the reference potentials, a first electrode coupled to said control electrode of said one of said differentially connected transistors, and a second electrode coupled to receive the predetermined power supply potential, only the one of the first and second transistor means receiving the reference voltage of the lowest magnitude being rendered conductive so that the regulator means is responsive to only the reference voltage having the lowest potential.*

*21. A circuit in accordance with claim 1, wherein said regulator means further includes in combination;*

*first transistor means of a first conductivity type having first, second and control electrodes, said control electrode being coupled to the reference means, said second electrode being connected to receive a power supply potential;*

*current supply means coupled to said first electrode of said first transistor means, said first transistor means developing an intermediate voltage at said first electrode thereof having a magnitude with a predetermined relation to the reference magnitude provided at the control electrode thereof; and*

*second transistor means of a second conductivity type having control, first and second electrodes, said control electrode of said second transistor means being coupled to said first electrode of said first transistor means, said second electrode of said second transistor means being adapted to receive a power supply potential and said first electrode of said second transistor means being coupled to the capacitor, said second transistor substantially returning the intermediate voltage back to the reference level at said first electrode thereof so that the reference level can be coupled to the capacitor.*

*22. A circuit in accordance with claim 21 wherein:*

*said first transistor means includes a bipolar transistor having emitter, base and collector electrodes, respectively corresponding to said first, control and second electrodes, and said intermediate voltage differs from said referenced voltage by the base-to-emitter voltage drop of said bipolar transistor; and*

*said second transistor means includes a further bipolar transistor having emitter, base and collector electrodes, respectively corresponding to said, first, control and second electrodes thereof, said emitter-to-base junction of said further bipolar transistor substantially returning the intermediate voltage back to the reference level.*

*23. A circuit in accordance with claim 1, wherein said discharge circuit means includes a current supply means comprising:*

*first transistor means of a first conductivity type having first, second and control electrodes, said control electrode being coupled to receive a bias voltage, said second electrode being connected to receive a power supply potential;*

*current supply means providing an unregulated current;*

*circuit means coupling said current supply means to said first electrode of said first transistor means, said first transistor means developing an intermediate voltage at said first electrode thereof having the magnitude of a predetermined relation to said bias voltage provided at the control electrode thereof in response to said unregulated current from said current supply;*

*second transistor means of a second conductivity type having control, first and second electrodes, said control electrode of said second transistor means being coupled to said first electrode of said first transistor means; and*

*resistive means coupling said first electrode of said second transistor means to a power supply conductor, said second electrode of said second transistor means being adapted to provide a regulated current having a magnitude which is much more constant than said unregulated current provide by said current supply means, said regulated current enabling the capacitor to be discharged at a predetermined constant rate.*

*24. A circuit in accordance with claim 23, wherein:*

*said first transistor means includes a bipolar transistor having emitter, base and collector electrodes respectively corresponding to said first, control and second electrodes, and said intermediate voltage differs from said bias voltage by the base-to-emitter voltage drop of said bipolar transistor; and*

*said second transistor means includes a further bipolar transistor having emitter, base and collector electrodes respectively corresponding to said first, control and second electrodes, said emitter-to-base junction of said*

*further bipolar transistor returning the intermediate voltage substantially to the reference level applied to the base electrode of the first transistor means so that said regulated current developed at the collector electrode of said second transistor means is precisely controlled.*

*25. A circuit in accordance with claim 23 wherein said circuit means includes a switch means for enabling and disabling the current supply means.*

*26. A circuit in accordance with claim 4 wherein said differential amplifier further includes:*

*current supply means;*

*differentially connected first and second electron control means each having first, second and control electrodes, said first and second electron control means having commonly connected first electrodes which are coupled to said current supply means; and*

*differential-to-single ended converter means coupled between said second electrodes of said differentially connected first and second electron control means, and said discharge circuit means.*

*27. A circuit in accordance with claim 26 wherein said first and second electron control means each include at least one transistor.*

*28. A circuit in accordance with claim 26 further having a selecting circuit for controlling which of a plurality of reference voltages of different potentials is applied to the control electrode of one of said differentially connected electron control means, the selecting circuit including in combination:*

*first transistor means having a control electrode adapted to receive one of the reference voltages, a first electrode connected to said control electrode of said one of said differentially connected electron control means, and a second electrode coupled to receive a predetermined power supply potential; and*

*second transistor means having a control electrode adapted to receive another of the reference potentials, a first electrode coupled to said control electrode of said one of said differentially connected transistors, and a second electrode coupled to receive the predetermined power supply potential, only the one of the first and second transistor means receiving the reference voltage of the lowest magnitude being rendered conductive so that the regulator means is responsive to only the reference voltage having the lowest potential.*

*29. A circuit in accordance with claim 28 further including:*

*circuit means connected to said reference means for selectively elevating some of the reference levels so that another of the reference levels is applied to said differential amplifier by said selecting circuit.*

*30. A circuit in accordance with claim 5 wherein said emitter follower circuit includes in combination:*

*first transistor means of a first conductivity type having first, second and control electrodes, said control electrode being coupled to the reference means, said second electrode being connected to receive a power supply potential;*

*current supply means coupled to said first electrode of said first transistor means, said first transistor means developing an intermediate voltage at said first electrode thereof having a magnitude with a predetermined relation to the reference voltage provided at the control electrode thereof; and*

*second transistor means of a second conductivity type having control, first and second electrodes, said control electrode of said second transistor means being coupled to said first electrode of said first transistor means, said second electrode of said second transistor means being adapted to receive a power supply potential and said first electrode of said second transistor means being coupled to the capacitor, said second transistor substantially returning the intermediate voltage back to the reference level at said first electrode thereof so that the reference level can be selectively coupled to the capacitor.*

*31. An emitter follower circuit in accordance with claim 30 wherein:*

*said first transistor means includes a bipolar transistor having emitter, base and collector electrodes, respectively corresponding to said first, control and second electrodes, and said intermediate voltage differs from said reference voltage by the base-to-emitter voltage drop of said bipolar transistor; and*

*said second transistor means includes a further bipolar transistor having emitter, base and collector electrodes, respectively corresponding to said, first, control and second electrodes thereof, said emitter-to-base junction of said further bipolar transistor substantially returning the intermediate voltage back to the reference level.*

*32. A circuit in accordance with claim 6 wherein the regulator means further includes:*

*first and second differential regulator circuits, each of said differential regulator circuits having current supply means, differentially connected first and second transistor means each having first, second and control electrodes, said first and second transistor means having commonly connected first electrodes which are coupled to said current supply means, differential-to-single ended converter means coupled between said second electrodes of said differentially connected first and second transistor means, and said discharge circuit means, and*

*first and second emitter follower regulator circuits, each of said emitter follower regulator circuits having third transistor means of a first conductivity type having first, second and control electrodes, said control electrode being coupled to the reference means, said second electrode being connected to receive a power supply potential; current supply means coupled to said first electrode of said third transistor means, said third transistor means developing an intermediate voltage at said first electrode thereof having a magnitude with a predetermined relation to the reference magnitude provided at the control electrode thereof; and fourth transistor means of a second conductivity type having control, first and second electrodes, said control electrode of said fourth transistor means being coupled to said first electrode of said third transistor means, said second electrode of said fourth transistor means being adapted to receive a power supply potential and said first electrode of said fourth transistor means being coupled to the capacitor, said fourth transistor substantially returning the intermediate voltage back to the reference level at said first electrode thereof so that the reference level can be coupled to the capacitor.*

*33. A circuit in accordance with claim 32 further having a selecting circuit for controlling which of a plurality of reference voltages of different potentials is applied to the control electrode of one of said differentially connected transistor means of each of said differential voltage regulator circuit the selecting circuit including:*

*fifth means having a control electrode adapted to receive one of the reference voltages, a first electrode connected to said control electrode of said one of said differentially connected transistor means, and a second electrode coupled to receive a predetermined power supply potential; and*

*sixth transistor means having a control electrode adapted to receive another of the reference potentials, a first electrode coupled to said control electrode of said one of said differentially connected transistors, and a second electrode coupled to receive the predetermined power supply potential, only the one of the fifth and sixth transistor means receiving the reference voltage of the lowest magnitude being rendered conductive so that each differential regulator means is responsive to only the reference voltage having the lowest potential.*

*34. A circuit in accordance with claim 7, wherein said second portion of said discharge circuit means includes a current supply means comprising:*

*first transistor means of a first conductivity type having first, second and control electrodes, said control electrode being coupled to receive a bias voltage, said second electrode being connected to receive a power supply potential;*

*current supply means providing an unregulated current;*

*circuit means coupling said current supply means to said first electrode of said first transistor means, said first transistor means developing an intermediate voltage at said first electrode thereof having the magnitude of a predetermined relation to said bias voltage provided at the control electrode thereof in response to said unregulated current from said current supply;*

*second transistor means of a second conductivity type having control, first and second electrodes, said control electrode of said second transistor means being coupled to said first electrode of said first transistor means; and*

*resistive means coupling said first electrode of said second transistor means to a power supply conductor, said second electrode of said second transistor means being adapted to provide a regulated current having a magnitude which is more constant than said unregulated current provided by said current supply means, said regulated current enabling the capacitor to be discharged at a predetermined constant rate.*

*35. A circuit in accordance with claim 34, wherein:*

*said first transistor means includes a bipolar transistor having emitter, base and collector electrodes respectively corresponding to said first, control and second electrodes, and said intermediate voltage differs from said bias voltage by the base-to-emitter voltage drop of said bipolar transistor; and*

*said second transistor means includes a further bipolar transistor having emitter, base and collector electrodes respectively corresponding to said first, control and second electrodes, said emitter-to-base junction of said further bipolar transistor returning the intermediate voltage substantially to the reference level applied to the base electrode of the first transistor means so that said regulated current developed at the collector electrode of said second transistor means is precisely controlled.*

*36. A circuit in accordance with claim 35, wherein said circuit means includes a switchable electron control means for enabling and disabling the current supply means.*

*37. A circuit in accordance with claim 7 wherein said first portion of said regulator means includes:*

*current supply means;*

*differentially connected first and second transistor means each having first, second and control electrodes, said first and second transistor means having commonly connected first electrodes which are coupled to said current supply means; and*

*differential-to-single ended converter means coupled between said second electrodes of said differentially connected first and second transistor means, and said discharge circuit means.*

*38. A circuit in accordance with claim 7, wherein said second regulator means further includes in combination:*

*first transistor means of a first conductivity type having first, second and control electrodes, said control electrode being coupled to the reference means, said second electrode being connected to receive a power supply potential;*

*current supply means coupled to said first electrode of said first transistor means, said first transistor means developing an intermediate voltage at said first electrode thereof having a magnitude with a predetermined relation to the reference magnitude provided at the control electrode thereof; and*

*second transistor means of a second conductivity type having control, first and second electrodes, said control electrode of said second transistor means being coupled to said first electrode of said first transistor means, said second electrode of said second transistor means being adapted to receive a power supply potential and said first electrode of said second transistor means being coupled to the capacitor, said second transistor substantially returning the intermediate voltage back to the reference level at said first electrode thereof so that the reference level can be coupled to the capacitor.*

*39. A circuit in accordance with claim 11 wherein said regulator means includes:*

*current supply means;*

*said differential amplifier having first and second transistor means each having first, second and control electrodes, said first and second transistor means being differentially coupled with each other, said first and second transistor means having commonly connected first electrodes which are coupled to said current supply means; and*

*differential-to-single ended converter means coupled between said second electrodes of said differentially connected first and second transistor means, and said discharge circuit means.*

*40. A circuit in accordance with claim 39 further having a selecting circuit for controlling which of a plurality of reference voltages of different potentials is applied to the control electrode of one of said differentially connected transistor means, the selecting circuit including:*

*third transistor means having a control electrode adapted to receive one of the reference voltages, a first electrode connected to said control electrode of said one of said differentially connected transistor means, and a second electrode coupled to receive a power supply potential; and*

*fourth transistor means having a control electrode adapted to receive another of the reference potentials, a first electrode coupled to said control electrode of said one of said differentially connected transistors, and a second electrode coupled to receive the power supply potential, only the one of said third and fourth transistor means receiving the reference voltage of the lowest magnitude being rendered conductive so that*

*the regulator means is responsive to only the reference voltage having the lowest potential.*

*41. A circuit in accordance with claim 39, wherein said regulator means further includes in combination:*

*third transistor means of a first conductivity type having first, second and control electrodes, said control electrode being coupled to the reference means, said second electrode being connected to receive a power supply potential;*

*current supply means coupled to said first electrode of said third transistor means, said third transistor means developing an intermediate voltage at said first electrode thereof having a magnitude with a predetermined relation to the reference magnitude provided at the control electrode thereof; and*

*fourth transistor means of a second conductivity type having control, first and second electrodes, said control electrode of said fourth transistor means being coupled to said first electrode of said third transistor means, said second electrode of said fourth transistor means being adapted to receive a power supply potential and said first electrode of said fourth transistor means being coupled to the capacitor, said fourth transistor substantially returning the intermediate voltage back to the reference level at said first electrode thereof so that the reference level can be coupled to the capacitor.*

*42. A circuit in accordance with claim 41 wherein:*

*said third transistor means includes a bipolar transistor having emitter, base and collector electrodes, respectively corresponding to said first, control and second electrodes, and said intermediate voltage differs from said reference voltage by the base-to-emitter voltage drop of said bipolar transistor; and*

*said fourth transistor means includes a further bipolar transistor having emitter, base and collector electrodes, respectively corresponding to said, first, control and second electrodes thereof, said emitter-to-base junction of said further bipolar transistor substantially returning the intermediate voltage back to the reference level.*

*43. A circuit in accordance with claim 11, wherein said discharge circuit means includes a current supply means comprising:*

*first transistor means of a first conductivity type having first, second and control electrodes, said control electrode being coupled to receive a bias voltage, said second electrode being connected to receive a power supply potential;*

*current supply means providing an unregulated current;*

*circuit means coupling said current supply means to said first electrode of said first transistor means, said first transistor means developing an intermediate voltage at said first electrode thereof having the magnitude of a predetermined relation to said bias voltage provided at the control electrode thereof in response to said unregulated current from said current supply;*

*second transistor means of a second conductivity type having control, first and second electrodes, said control electrode of said second transistor means being coupled to said first electrode of said first transistor means; and*

*resistive means coupling said first electrode of said second transistor means to a power supply conductor, said second electrode of said second transistor means being adapted to provide a regulated current having a magnitude which is much more constant than said unregulated current provide by said current supply means, said regulated current enabling the capacitor to be discharged at a predetermined constant rate.*

*44. A circuit in accordance with claim 13 wherein said regulator means further includes:*

*first and second differential regulator circuits, each of said differential regulator circuits having current supply means, differentially connected first and second transistor means each having first, second and control electrodes, said first and second transistor means having commonly connected first electrodes which are coupled to said current supply means, differential-to-single ended converter means coupled between said second electrodes of said differentially connected first and second transistor means, and said discharge circuit means, and*

*first and second emitter follower regulator circuits, each of said emitter follower regulator circuits having third transistor means having first, second and control electrodes, said control electrode being coupled to the reference means, said second electrode being connected to receive a power supply potential; current supply means coupled to said first electrode of said third transistor means, said third transistor means developing an intermediate voltage at said first electrode thereof having a magnitude with a predetermined relation to the reference magnitude provided at the control electrode thereof; and fourth transistor means of a conductivity type opposite to the conductivity type of said third transistor means and having control, first and second electrodes, said control electrode of said fourth transistor means being coupled to said first electrode of said third transistor means, said second electrode of said fourth transistor means being adapted to receive a power supply potential and said first electrode of said fourth transistor means being coupled to the capacitor means, said fourth transistor substantially returning the intermediate voltage back to the reference level at said first electrode thereof so that the reference level can be coupled to the capacitor means.*

*45. A circuit in accordance with claim 44 further having a selecting circuit for controlling which of a plurality of reference voltages of different potentials is applied to the control electrode of one of said differentially connected transistor means of each of said differential voltage regulator circuit the selecting circuit including:*

*fifth means having a control electrode adapted to receive one of the reference voltages, a first electrode connected to said control electrode of said one of said differentially connected transistor means, and a second electrode coupled to receive a predetermined power supply potential; and*

*sixth transistor means having a control electrode adapted to receive another of the reference potentials, a first electrode coupled to said control electrode of said one of said differentially connected transistors, and a second electrode coupled to receive the predetermined power supply potential, only the one of the fifth and sixth transistor means receiving the reference voltage of the lowest magnitude being rendered conductive so that each differential regulator means is responsive to only the reference voltage having the lowest potential.*

*46. A circuit in accordance with claim 14, wherein one of said portions of said discharge circuit means includes a current supply means comprising:*

*first transistor means of a first conductivity type having first, second and control electrodes, said control elec-*

*trode being coupled to receive a bias voltage, said second electrode being connected to receive a power supply potential;*

*current supply means providing an unregulated current;*

*circuit means coupling said current supply means to said first electrode of said first transistor means, said first transistor means developing an intermediate voltage at said first electrode thereof having the magnitude of a predetermined relation to said bias voltage provided at the control electrode thereof in response to said unregulated current from said current supply;*

*second transistor means of a second conductivity type having control, first and second electrodes, said control electrode of said second transistor means being coupled to said first electrode of said first transistor means; and*

*resistive means coupling said first electrode of said second transistor means to a power supply conductor, said second electrode of said second transistor means being adapted to provide a regulated current having a magnitude which is more constant than said unregulated current provided by said current supply means, said regulated current enabling the capacitor to be discharged at a predetermined constant rate.*

*47. A circuit in accordance with claim 46, wherein:*

*said first transistor means includes a bipolar transistor having emitter, base and collector electrodes respectively corresponding to said first, control and second electrodes, and said intermediate voltage differs from said bias voltage by the base-to-emitter voltage drop of said bipolar transistor; and*

*said second transistor means includes a further bipolar transistor having emitter, base and collector electrodes respectively corresponding to said first, control and second electrodes, said emitter-to-base junction of said further bipolar transistor returning the intermediate voltage substantially to the reference level applied to the base electrode of the first transistor means so that said regulated current developed at the collector electrode of said second transistor means is precisely controlled.*

*48. A circuit in accordance with claim 47, wherein said circuit means includes a switchable electron control means for enabling and disabling the current supply means.*

*49. A circuit suitable for being manufactured in monolithic integrated circuit form and for developing a waveform having a plurality of different voltage levels at least one of which is greater than a preceding level and at least one of which is less than a preceding level across a capacitive load external to the monolithic chip, such circuit being adapted to operate in cooperation with a plurality of reference voltages representing the different voltage levels of the waveform and including in combination:*

*first voltage regulator means having a differential amplifier with an input terminal and an output terminal, said input terminal being connected to receive a first reference voltage related to one of the voltage levels of the waveform and said output terminal being coupled to the capacitive load, said first voltage regulator means tending to prevent the voltage across the capacitive load from rising above a predetermined voltage which is related to said first reference voltage to facilitate the generation of one level of the waveform; and*

*second voltage regulator means including an emitter follower circuit having an input terminal and an output terminal, said input terminal being coupled to receive a second of the reference voltages, said output terminal being coupled to said capacitive load, said second voltage regulator means tending to prevent the capacitive load from discharging below a voltage level which is related to the second reference voltage to facilitate the generation of another level of said waveform.*

*50. A circuit in accordance with claim 49, wherein said first voltage regulator means further includes:*

*first current supply means;*

*differentially connected first and second transistor means, each having first, second and control electrodes, said first and second transistor means having commonly connected first electrodes which are coupled to said current supply means;*

*differential-to-single ended converter means for providing a regulated output voltage being coupled between said second electrodes of said differentially connected first and second electron control means; and*

*selecting circuit means for controlling which of the plurality of reference voltages of different potentials is applied to the control electrode of one of said differentially connected transistor means, the selecting circuit including third transistor means having a control electrode adapted to receive one of the reference voltages, a first electrode connected to said control electrode of said one of said differentially connected transistor means, and a second electrode coupled to receive a predetermined power supply potential; and fourth transistor means having a control electrode adapted to receive another of the reference potentials, a first electrode coupled to said control electrode of said one of said differentially connected transistor means, and a second electrode coupled to receive the predetermined power supply potential, only the one of the third and fourth transistor means receiving the reference voltage of the lowest magnitude being rendered conductive so that the differentially connected first and second transistor means is responsive to only the reference voltage having the lowest potential.*

*51. A circuit in accordance with claim 49, wherein said emitter follower circuit includes in combination:*

*first transistor means of a first conductivity type having first, second and control electrodes, said control electrode being coupled to the reference circuit for receiving another reference potential, said second electrode being connected to receive a power supply potential;*

*second current supply means coupled to said first electrode of said first transistor means, said first transistor means developing an intermediate voltage at said first electrode thereof having a magnitude with a predetermined relation to said other reference magnitude provided at the control electrode thereof; and*

*second transistor means of a second conductivity type having control, first and second electrodes, said control electrode of said second transistor means being coupled to said first electrode of said second transistor means, said second electrode of said fifth transistor means being adapted to receive a power supply potential and said first electrode of said second transistor means being coupled to the capacitor, said second transistor means substantially returning the intermediate voltage back to the reference level at said first electrode thereof.*

* * * * *